(12) United States Patent
Cox

(10) Patent No.: US 7,334,208 B1
(45) Date of Patent: Feb. 19, 2008

(54) CUSTOMIZATION OF STRUCTURED ASIC DEVICES USING PRE-PROCESS EXTRACTION OF ROUTING INFORMATION

(75) Inventor: William D. Cox, Chapel Hill, NC (US)

(73) Assignee: ViASIC, Inc., Durham, NC (US)

( * ) Notice: Subject to any disclaimer, the term of this patent is extended or adjusted under 35 U.S.C. 154(b) by 119 days.

(21) Appl. No.: 10/904,411

(22) Filed: Nov. 9, 2004

(51) Int. Cl.
G06F 17/50 (2006.01)

(52) U.S. Cl. .............................. 716/11; 716/2; 716/12; 716/15

(58) Field of Classification Search .................... 716/2, 716/11, 12, 15
See application file for complete search history.

(56) References Cited

U.S. PATENT DOCUMENTS

| | | |
|---|---|---|
| 4,641,108 A | 2/1987 | Gill, Jr. |
| 4,713,792 A | 12/1987 | Hartmann et al. |
| 4,734,654 A | 3/1988 | Fernandez |
| 4,760,349 A | 7/1988 | Park et al. |
| 5,068,603 A | 11/1991 | Mahoney |
| 5,317,919 A | 6/1994 | Awtrey |
| 5,367,430 A | 11/1994 | DeVoe et al. |
| 5,404,265 A | 4/1995 | Moresco et al. |
| 5,459,634 A | 10/1995 | Nelson et al. |
| 5,517,040 A | 5/1996 | Hedman et al. |
| 5,590,016 A | 12/1996 | Fujishiro et al. |
| 5,815,004 A | 9/1998 | Trimberger et al. |
| 5,815,726 A | 9/1998 | Cliff |
| 5,821,776 A | 10/1998 | McGowan |
| 5,825,202 A | 10/1998 | Tavana et al. |
| 5,874,834 A | 2/1999 | New |
| 5,883,423 A | 3/1999 | Patwa et al. |
| 5,898,318 A | 4/1999 | Pedersen |
| 5,905,385 A | 5/1999 | Sharpe-Geisler |
| 5,999,015 A | 12/1999 | Cliff et al. |
| 6,014,038 A | 1/2000 | How et al. |
| 6,020,755 A | 2/2000 | Andrews et al. |
| 6,150,837 A | 11/2000 | Beal et al. |

(Continued)

FOREIGN PATENT DOCUMENTS

EP 0491567 6/1992

(Continued)

OTHER PUBLICATIONS

"International Search Report" (European Patent Office), in Triad Semiconductor, Inc. International Patent Application Serial No. PCT/US2005/005836, Aug. 1, 2005.

(Continued)

*Primary Examiner*—Thuan Do
(74) *Attorney, Agent, or Firm*—Tillman Wright, PLLC; James D. Wright; Chad D. Tillman

(57) ABSTRACT

Customization of structured ASIC devices using pre-process extraction of routing information. Embodiments of the invention can enable a router that can automatically extract a routing graph for a structured ASIC, where the routing graph represents available routing resources on fixed metal layers. The routing graph can be extracted as a pre-process, and saved in a technology file for later use by the router. Additionally, each unique fixed metal wire type found in the layout can be characterized with a master wire definition, including resistance and capacitance estimates. In some embodiments, a global-routing graph can further be extracted from a detailed routing graph.

26 Claims, 14 Drawing Sheets

U.S. PATENT DOCUMENTS

| | | | |
|---|---|---|---|
| 6,166,403 A | 12/2000 | Castagnetti et al. | |
| 6,184,707 B1 | 2/2001 | Norman et al. | |
| 6,194,912 B1 | 2/2001 | Or-Bach | |
| 6,236,229 B1 | 5/2001 | Or-Bach | |
| 6,242,767 B1 | 6/2001 | How et al. | |
| 6,245,634 B1 | 6/2001 | Or-Bach | |
| 6,278,148 B1 | 8/2001 | Watanabe et al. | |
| 6,294,927 B1 | 9/2001 | Yoeli et al. | |
| 6,331,733 B1 | 12/2001 | Or-Bach et al. | |
| 6,331,789 B2 | 12/2001 | Or-Bach | |
| 6,331,790 B1 | 12/2001 | Or-Bach et al. | |
| 6,411,494 B1 | 6/2002 | Watt | |
| 6,467,074 B1 | 10/2002 | Katsioulas et al. | |
| 6,476,695 B1 | 11/2002 | Nakamichi | |
| 6,492,833 B1 | 12/2002 | Asson et al. | |
| 6,507,216 B1 | 1/2003 | Lane et al. | |
| 6,580,289 B2 | 6/2003 | Cox | |
| 6,588,005 B1 | 7/2003 | Kobayashi et al. | |
| 6,614,645 B1 | 9/2003 | Sakurai et al. | |
| 6,646,323 B2 | 11/2003 | Dirnecker et al. | |
| 6,646,860 B2 | 11/2003 | Takaramoto et al. | |
| 6,684,173 B2 | 1/2004 | Kessenich et al. | |
| 6,693,454 B2 | 2/2004 | Cox | |
| 6,696,856 B1 | 2/2004 | Smith et al. | |
| 6,873,185 B2 | 3/2005 | Cox | |
| 6,938,234 B1 * | 8/2005 | Teig et al. | 716/12 |
| 6,982,454 B2 | 1/2006 | Giuroiu et al. | |
| 7,089,524 B1 * | 8/2006 | Teig et al. | 716/12 |
| 2002/0084509 A1 | 7/2002 | Ballantine et al. | |
| 2002/0085334 A1 | 7/2002 | Figueroa et al. | |
| 2002/0186045 A1 | 12/2002 | Cox | |
| 2004/0004241 A1 | 1/2004 | Aton | |
| 2004/0027156 A1 | 2/2004 | Amarilio et al. | |
| 2004/0129966 A1 | 7/2004 | Giuroiu et al. | |

FOREIGN PATENT DOCUMENTS

| | | |
|---|---|---|
| EP | 0499383 | 8/1992 |

OTHER PUBLICATIONS

"International Search Report" (European Patent Office), in Triad Semiconductor, Inc. International Patent Application Serial No. PCT/US2005/011361, Aug. 5, 2005.

"Written Opinion of the International Search Authority" (European Patent Office), in Triad Semiconductor, Inc. International Patent Application Serial No. PCT/US2005/005836. Aug. 1, 2005.

"Written Opinion of the International Search Authority" (European Patent Office), in Triad Semiconductor, Inc. International Patent Application Serial No. PCT/US2005/011361, Aug. 5, 2005.

"International Preliminary Examination Report" (European Patent Office), in Triad Semiconductor, Inc. International Patent Application Serial No. PCT/US2005/005836, Jul. 14, 2006.

"International Preliminary Examination Report" (European Patent Office), in Triad Semiconductor, Inc. International Patent Application Serial No. PCT/US2005/011361, Jul. 6, 2006.

* cited by examiner 332    336

CUSTOMIZATION OF STRUCTURED ASIC DEVICES USING PRE-PROCESS EXTRACTION OF ROUTING INFORMATION

BACKGROUND OF INVENTION

In at least some circles, the term structured ASIC (application specific integrated circuit) has come to mean any ASIC that has at least one fixed layer of metal. Typically, all layers from contact down are also fixed. One difference between structured ASIC's and traditional gate arrays is that, with a structured ASIC, users can pay for fewer custom masks for their ASIC's, and more of the fixed masks can be shared between end-user designs.

Traditionally, creating an ASIC involves several steps, including synthesis, placement, and routing. A traditional ASIC router is capable of reading either LEF (library electronic format) files and DEF (design electronic format) files (a Cadence Design Systems, Inc. specific format), or GDSII (graphical design system 2). These files describe where components have been placed, and which connections the router needs to make to complete circuits. These connections are traditionally made on the configurable layers of metal by laying down metal traces on the various configurable metal layers, and vias between adjacent layers of metal to connect traces on different layers.

Traditionally, an ASIC router can use any configurable layer of metal, and route anywhere there is not already metal, so long as design rules (DRC or design rule checker) rules are met. DRC rules typically define minimum distances between isolated conductors on the various metal layers, and minimum width of these conductors, and often other DRC rules specific to the wafer fabrication process. Fixed metal typically occurs on the configurable layers for various reasons. For example, power trace routing is done as a pre-process to routing described above, and the power conductors are already defined on the configurable layers before the router runs as described above.

While many structured ASIC's are designed to reduce the number of configurable layers used in routing (thus reducing achievable circuit density), some structured ASIC fabrics are designed to use predefined fixed metal traces on the fixed layers of metal to conduct signals between the user's components. Using fixed metal in this way can improve circuit density. For example, a device disclosed in U.S. Pat. No. 6,580,289 makes use of wires on fixed metal layers to connect components, but the entire device can be configured using a single via layer.

Because traditional ASIC routers do not extract traces from the fixed layers of metal and make use of them in routing, techniques are used that rely on manual intervention, such as the use of customized scripts or even the manual creation of routing graphs. These approaches can lead to mismatches between the routing graph and the actual device, and resulting DRC rule errors. Additionally, the custom development effort increases the cost of the process.

SUMMARY OF INVENTION

Embodiments of the invention can enable a structured ASIC router that uses fixed metal routing traces. Such a router can be supported with generic place-and-route tools. Embodiments of the invention can automatically extract a routing graph for a structured ASIC, where the routing graph represents available routing resources on fixed metal layers. The routing graph can be extracted as a pre-process, and saved in a technology file for later use by the router. Additionally, each unique fixed metal wire type found in the layout can be characterized with a master wire definition, including resistance and capacitance estimates. In some embodiments, a global-routing graph can further be extracted from a detailed routing graph.

According to example embodiments of the invention, customization of a structured ASIC can begin by examining a physical layout for the structured ASIC in an automated fashion. Nodes can be created based on the physical layout, the nodes representing routing paths through layers of the structured ASIC. At least some of the routing paths can use fixed metal traces. Edges can also created based on the physical layout. The edges represent opportunities to connect the routing paths as represented by the nodes, so that a routing graph for the structured ASIC is created. The ASIC can then be routed using the routing graph to produce a design for a configured device.

In at least some embodiments, routing paths can use both fixed metal traces and empty space, and edges can represent configurable metal traces. In some embodiments, edges can alternatively, or in addition, represent potential locations for vias. In some embodiments, edges are created by ANDing together metal layers to determine where vias can be placed.

In some embodiments, an initial routing graph is a detailed routing graph and a global routing graph can further be created from the detailed routing graph. The creation of the global routing graph can include defining a plurality of master wires, each master wire representing a plurality of associated fixed metal wires having substantially similar conductivity and connectivity. A global routing graph can make use of the master wires to represent the associated fixed metal wires to use in routing.

Additionally, in some embodiments, one or more bundles of wires can be created to represent connectivity to a node of the global routing graph, and each bundle of wires can include at least some of the fixed metal wires as represented by the plurality of master wires. Electrical characteristics of the fixed metal wires, for example, resistance, capacitance, inductance and the like, can be extracted and stored in a technology file or technology files with the routing graph or routing graphs. Extraction of electrical characteristics can be done in many ways, including the use of a lookup table of master wire neighbor capacitance and a wire's status as between driven and floating. Finally, master bundles can be used to represent multiple bundles of wires in a fashion similar to the way in which master wires represent multiple wires.

With at least some embodiments, the various steps of the routing and extraction processes can be performed partially or completely on a processing platform such as workstation or other computer system. Computer program products including computer program code instructions in combination with the hardware form the means to carry out embodiments of the invention. In addition, appropriate technology files can be stored in the system, on either a fixed or removable storage medium.

BRIEF DESCRIPTION OF DRAWINGS

FIG. 1 illustrates metal layers that can be used by an ASIC router as represented by edges and nodes. FIG. 1 is shown in two views.

FIG. 3 illustrates how connections can be made using two fixed layers and one configurable metal layer of a structured ASIC. FIG. 3 is presented in three views.

FIG. 8 illustrates how metal features can be ANDed together to determine where vias can be placed according to some example embodiments of the invention. FIG. 8 is shown in two views where

FIG. 10 shows the structure of an ASIC in which fixed wires are connected with vias to wires using configurable metal. FIG. 10 is shown in two views, where

DETAILED DESCRIPTION

The present invention will now be described in terms of specific, example embodiments. It is to be understood that the invention is not limited to the example embodiments disclosed. It should also be understood that not every feature of the semiconductor devices described is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first. Also, the time between steps of a method can vary.

It should also be pointed out that references may be made throughout this disclosure to figures and descriptions using terms such as top, above, beneath, within, on, at, vertical, horizontal, and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Likewise, the numbering of layers of a device are also meant in relative terms. Any discussions which use these terms are meant to encompass various possibilities for orientation and placement.

It may be helpful for the reader to have understanding of ASIC routing concepts and terms as used in the context of this description. A routing graph as discussed herein is typically a data structure used by an ASIC router to represent portions of metal that can be used by the router. In a routing graph, for example, blank areas on a layer can be represented by nodes and edges can be defined between blank areas that overlap, and can thus be connected by vias. The router in such a construct can be used to find a minimum distance path through the routing graph to connect two points.

Figure 1A:
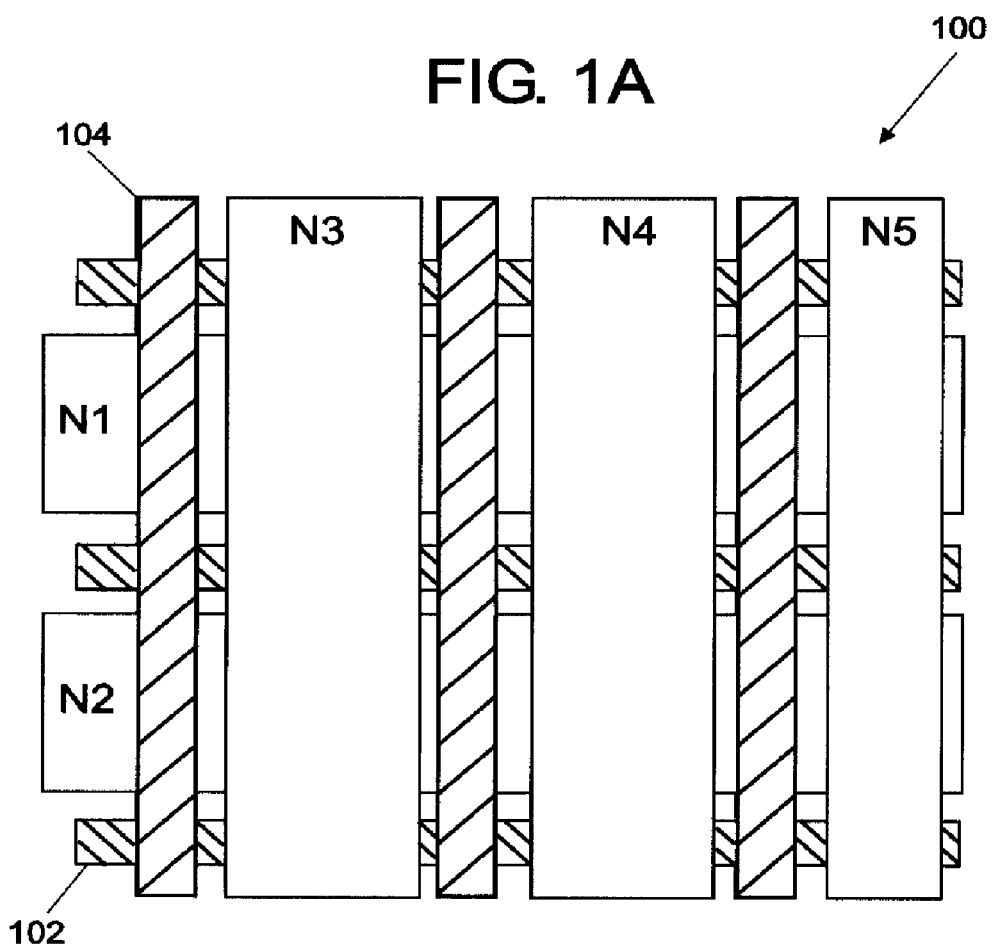
FIG. 1A shows the metal layers themselves and FIG. 1B shows a representation using nodes and connections between nodes.
Figure 1B:
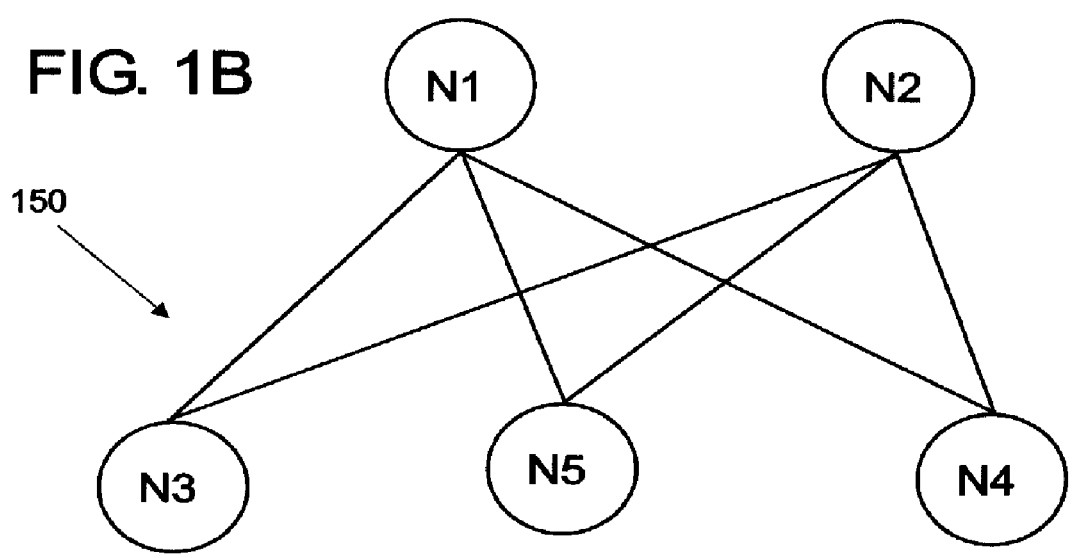

FIG. 1 further illustrates the above concepts. FIG. 1A depicts a section, 100, of a structured ASIC and shows metal-1 layer, 102, and metal-2 layer, 104. Blank areas that correspond to nodes are labeled N1 and N2 for metal-1 and N3, N4, and N5 for metal-2. These areas are available for use by a router like that disclosed via specific example embodiments of the invention. FIG. 1B shows a routing graph, 150, that illustrates how these nodes are interconnected.

Figure 2:
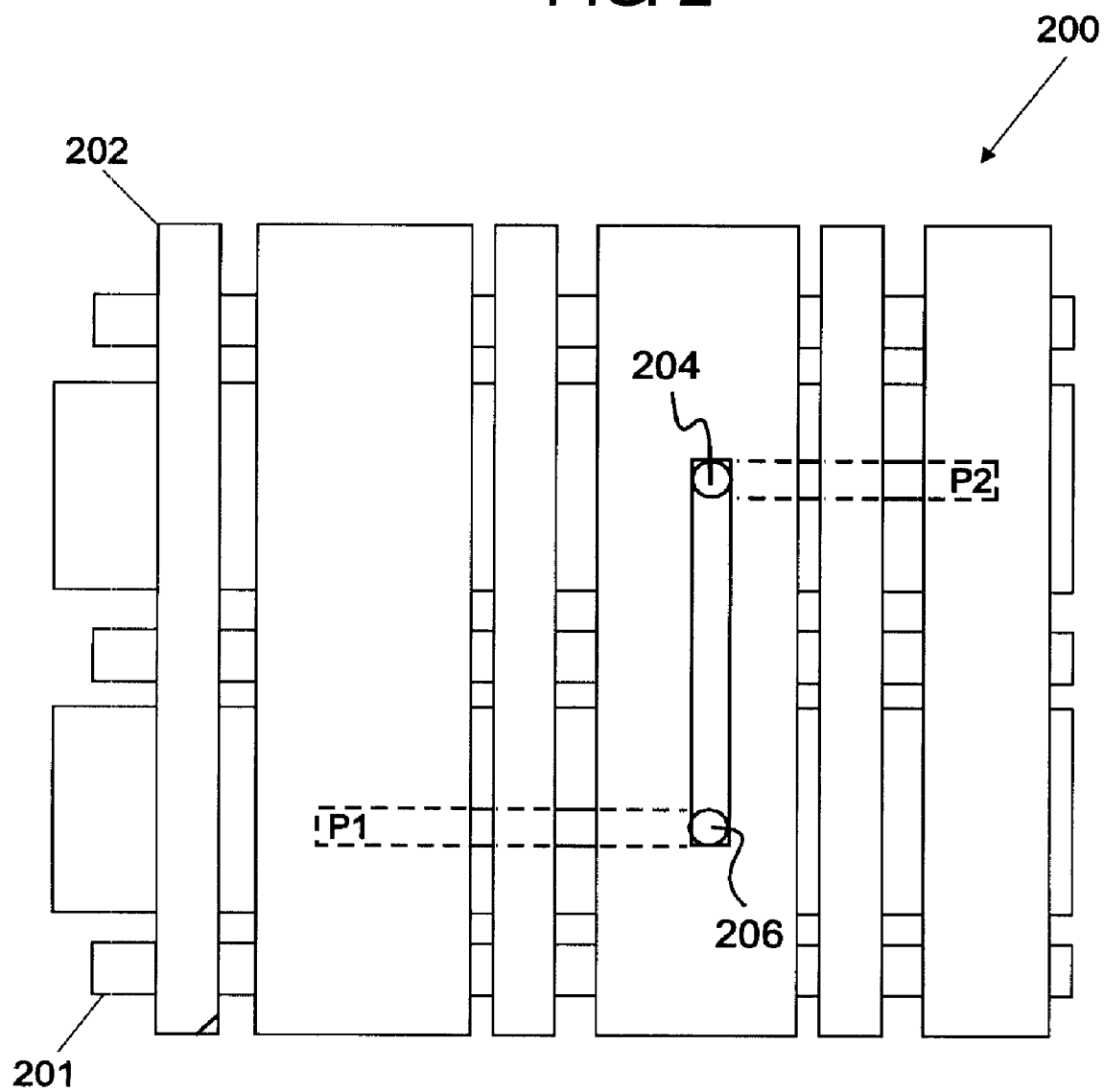
FIG. 2 illustrates the use of metal to connect two points as might be done by an ASIC router.

FIG. 2 illustrates a portion, 200, of the metal layers of s structured ASIC that is identical to that illustrated in FIG. 1, except that a connection between point P1 and point P2 have been routed. In FIG. 2, P1 and P2 are both in metal-1 layer 201. In order to make the connection through metal-2 layer 202, vias 204 and 206 are used.

Figure 3A:
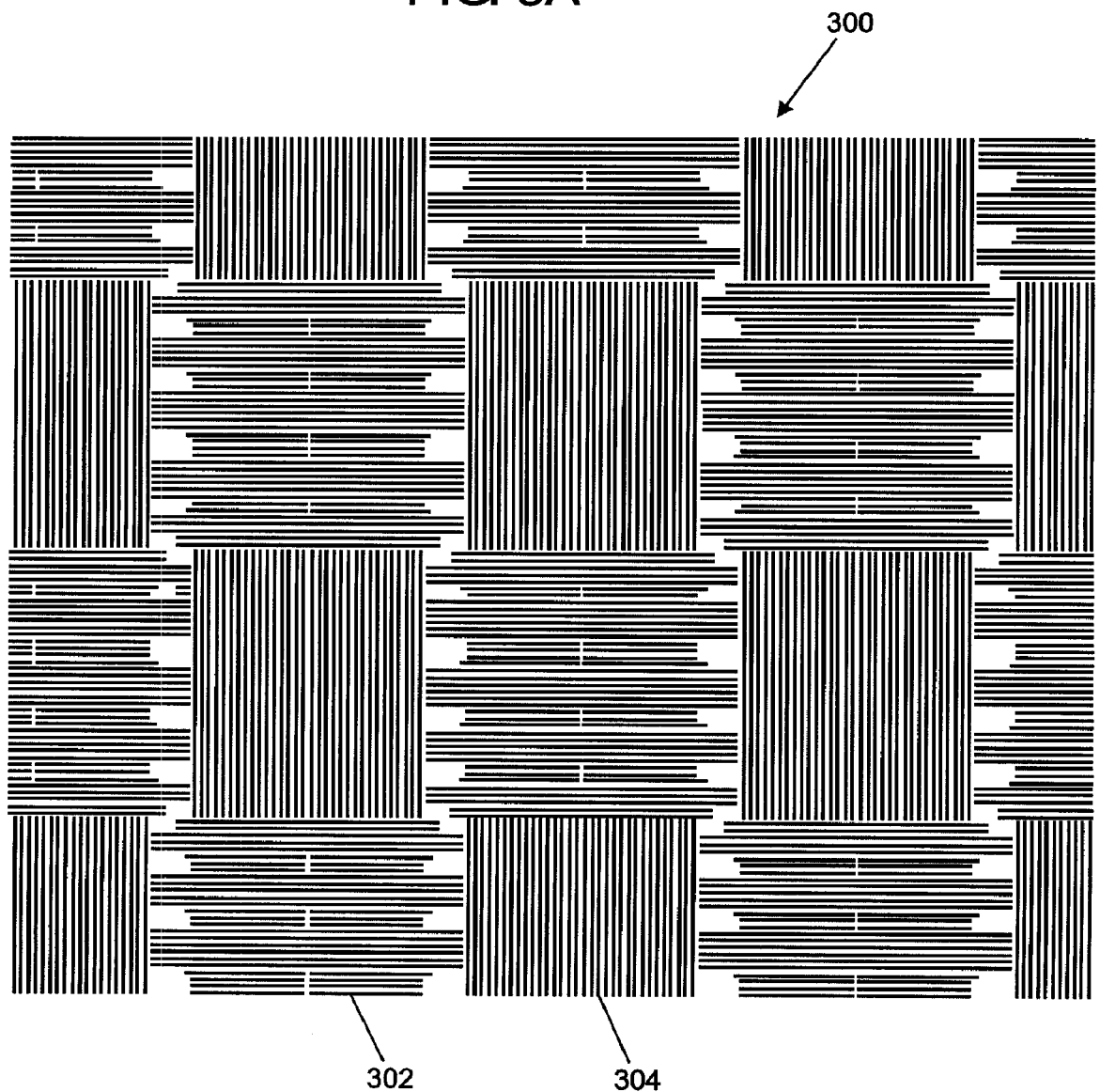
FIG. 3A shows a layer with only horizontal wires visible.
Figure 3B:
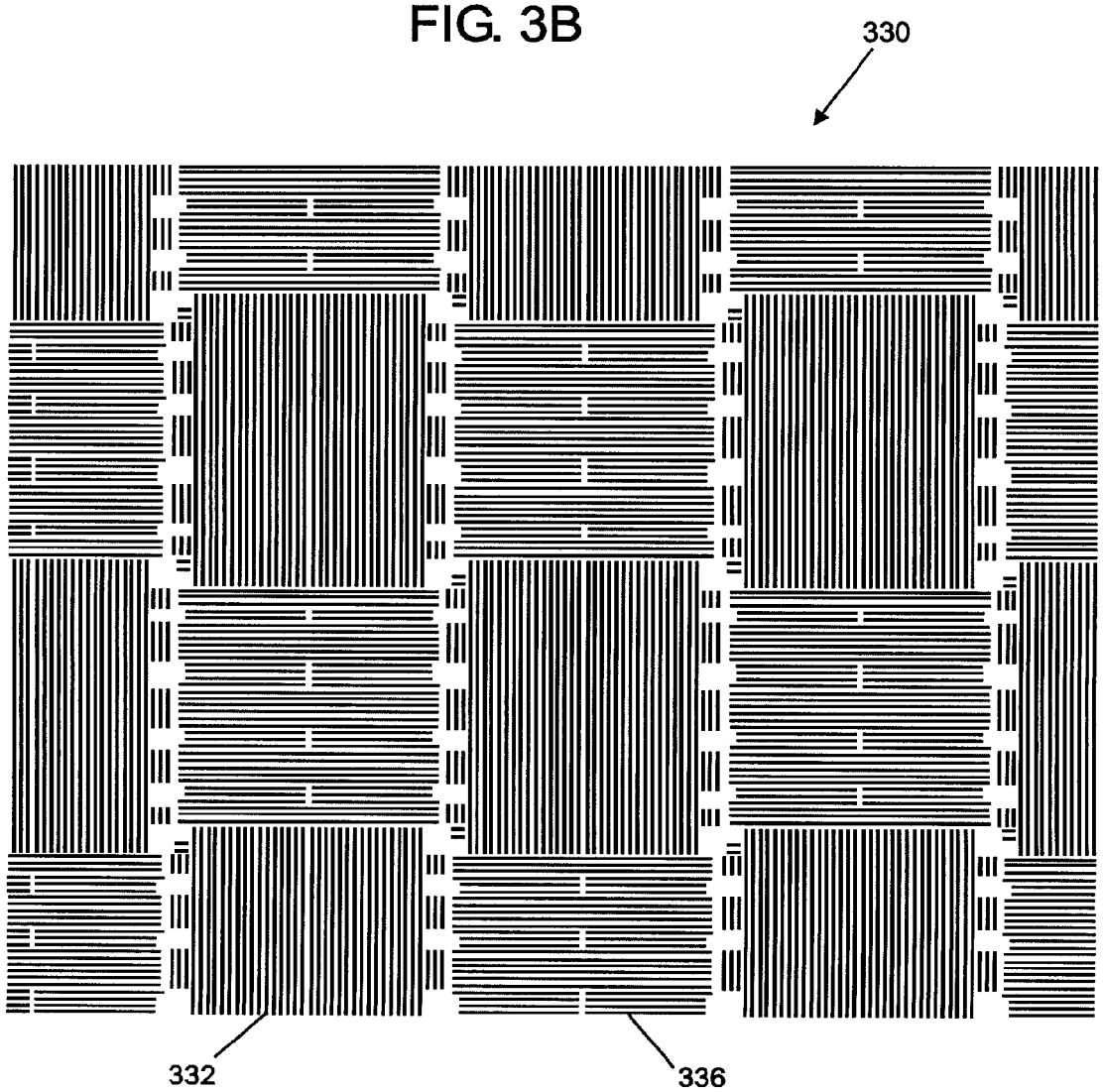
FIG. 3B shows the layer with only vertical wires visible.
Figure 3C:
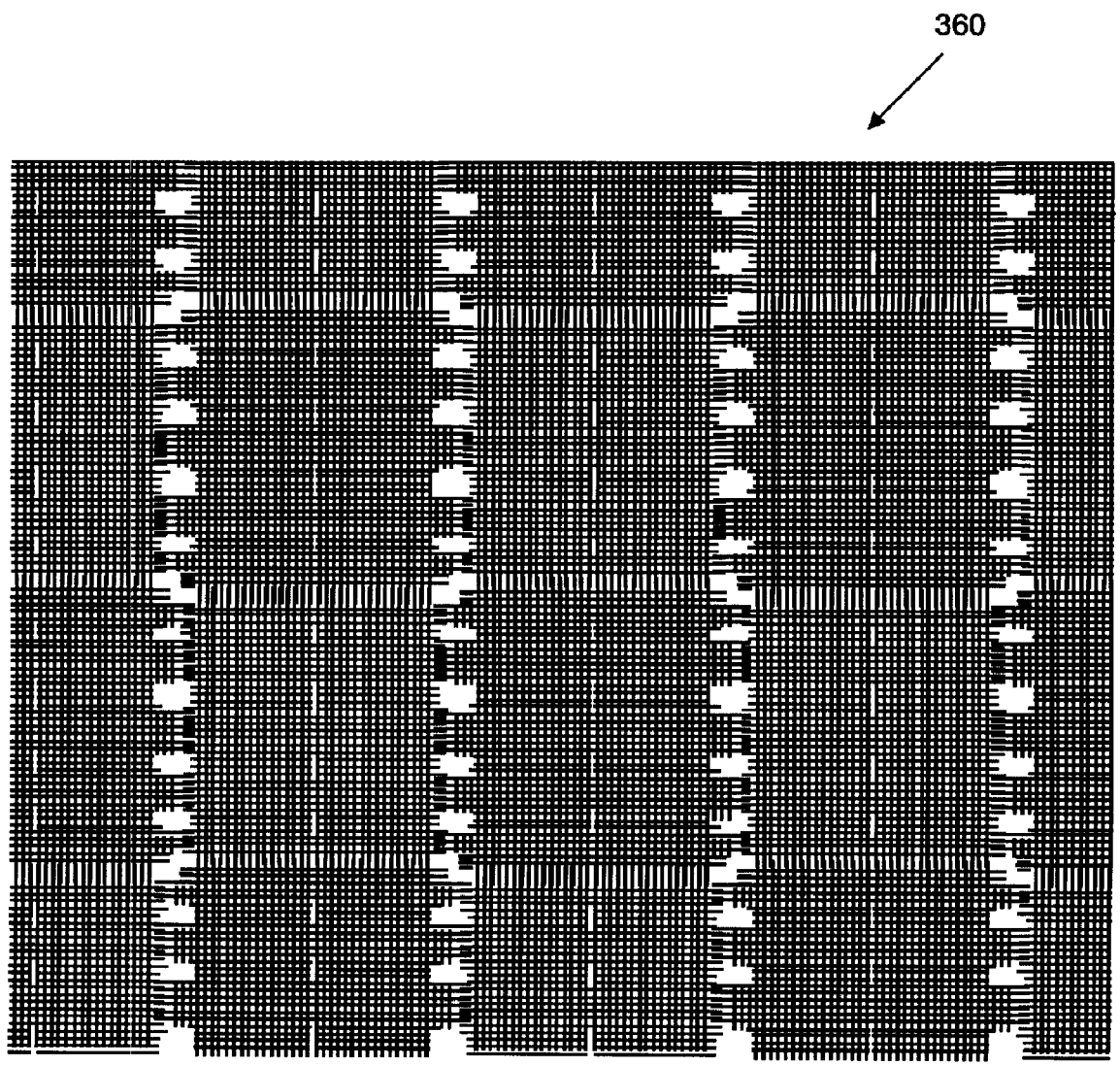
FIG. 3C shows both horizontal and vertical layers.
Figure 4:
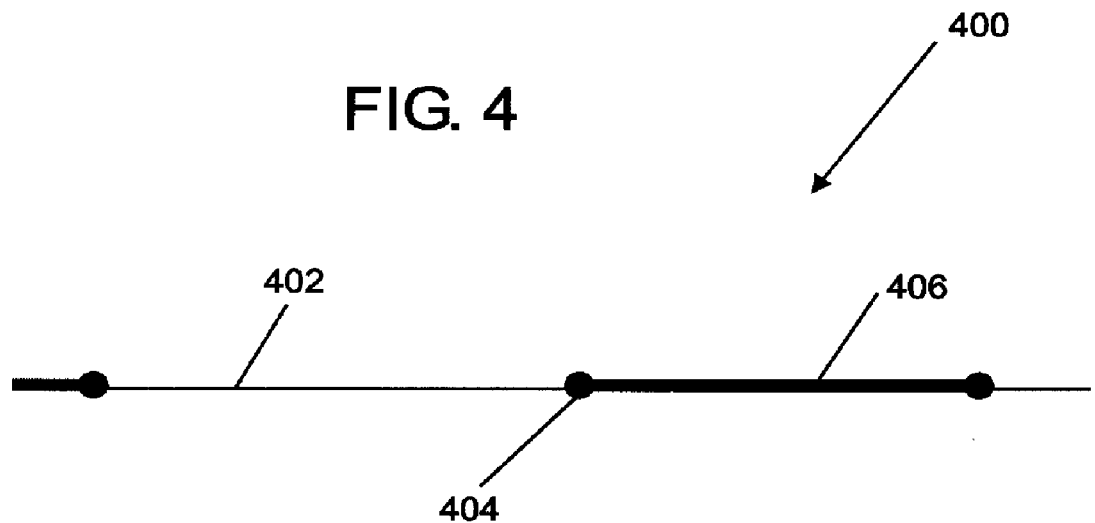
FIG. 4 shows how a signal can traverse a cell in an ASIC using the metal configuration shown in FIG. 3.
Figure 5:
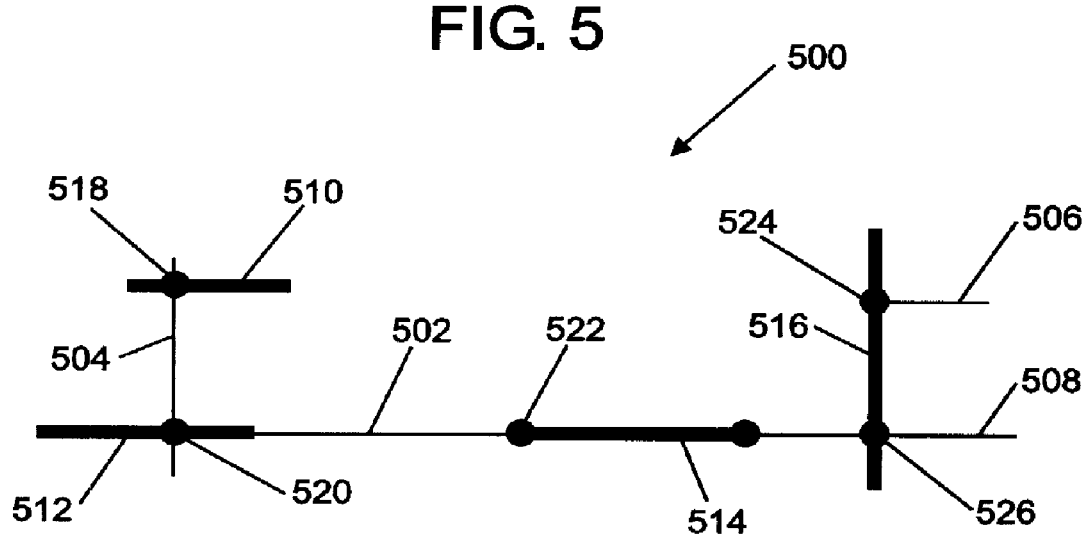
FIG. 5 shows a completed two-port net in an ASIC using the metal configuration shown in FIG. 3

FIGS. 3, 4, and 5 depict how signals can be interconnected using both fixed metal layers and a configurable via layer in embodiments of the invention. For purposes of this example, it can be assumed that metal-3 and metal-4 layers are used as routing layers, and that the via-layer in between (via-3) is used to configure the signal paths. FIG. 3 illustrates how wires run on the metal-3 and metal-4 layers of an example structured ASIC. FIG. 3A is a metal-3 plot, 300 showing horizontal wires in even cells 302, and vertical wires in odd cells 304. Notice that there are some short wires that do not extend to the edges of the even cells. These short wires can be used to connect to the I/O's (inputs and outputs) of the logic cells built below these metal layers. FIG. 3B is a metal-4 plot, 330, showing the vertical wires in even cells 332, and horizontal wires in odd cells 334. FIG. 3C shows a plot, 360, of the super-position of the layers depicted in FIG. 3A and FIG. 3B.

FIG. 4 shows how a user signal 400 is capable of traversing an even cell in metal-3, with section 402, and can then use a via-3 via, 404, to connect to metal-4, and continue horizontally through an odd cell with section 406 in the example structured ASIC depicted in FIG. 3. This alternating layer pattern allows the signal to traverse horizontally until a turn is desired. In this example, any time the horizontal signal crosses a vertical wire, there is a location that could have been used to connect the signal to a vertical routing track.

FIG. 5 shows a completed two-port net, 500, in the example structured ASIC of FIG. 3. Again, this signal is connected using nothing but fixed metal-3 and metal-4 wires, and configurable via-3 vias. Wire sections 502, 504, 506, and 508 are on metal-3. Section 506 is one of the ports. Wire sections 510, 512, 514, and 516 are on metal-4 and section 510 is the other port. Vias 518, 520, 522, 524, and 526 are configured on via-3 to make the connections needed to complete the net.

With the above concepts in mind, the reader can appreciate how a routing graph extractor according to embodiments of the invention determines the fixed wires on the fixed layers of metal, and creates nodes for these. Edges are created between wires to represent when it is possible to short two wires using a configurable layer of metal, such as a via layer. Note that a wire can span multiple layers, so long as fixed vias can be used to connect all the traces that make up the wire.

Figure 6:
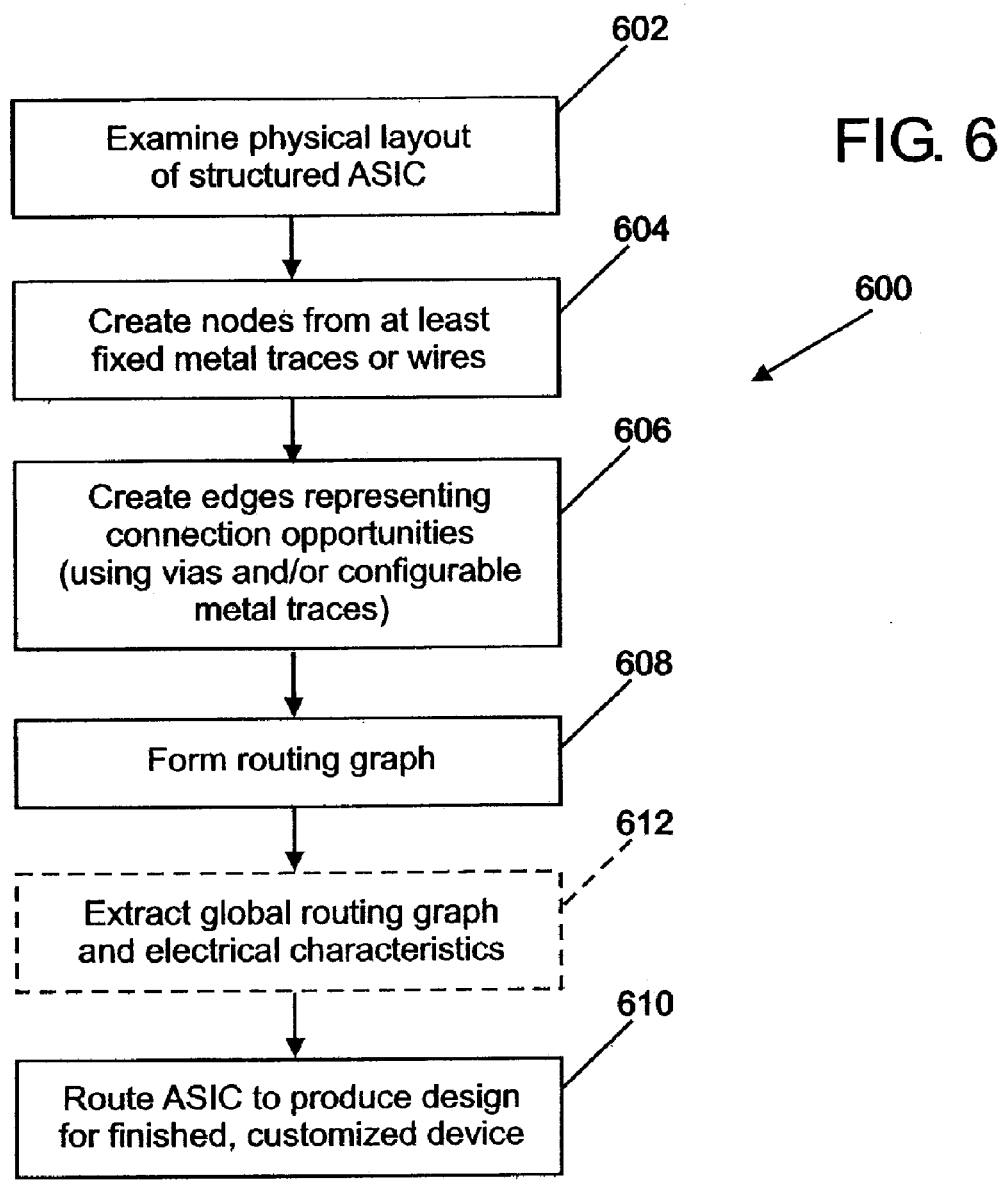
FIG. 6 is a flowchart illustrating a process according to example embodiments of the invention.

FIG. 6 is a flowchart that illustrates how a routing graph can be extracted according to some embodiments of the invention. FIG. 6 presents process 600 of extracting the routing graph as a series of process blocks. At block 602, the physical layout of the structured ASIC is examined. At block 604, nodes are formed to represent at least the fixed metal traces, wires, or areas of the ASIC. Note that in some embodiments, nodes can also be used to represent configurable metal. At block 606, edges are created representing connection opportunities between layers. These connection opportunities can be provided in various ways, depending on the chip architecture and design philosophy that applies to the particular structured ASIC. As an illustrative example, the use of vias in via layers to make such connections is shown in this disclosure, however, in some chip architectures, metal traces might be used. An algorithm for forming edges representing opportunities to connect traces using vias will be discussed below with respect to FIGS. 7 and 8.

Returning to FIG. 6, a routing graph for the structured ASIC of interest is formed at block 608, and is typically stored in a technology file. In some embodiments, the structured ASIC is then routed using the routing graph to produce a design for a finished, customized device at block 610. Optionally, at block 612, a further routing graph can be extracted. This option will be discussed in detail with respect to FIGS. 9, 10, and 11.

Figure 7:
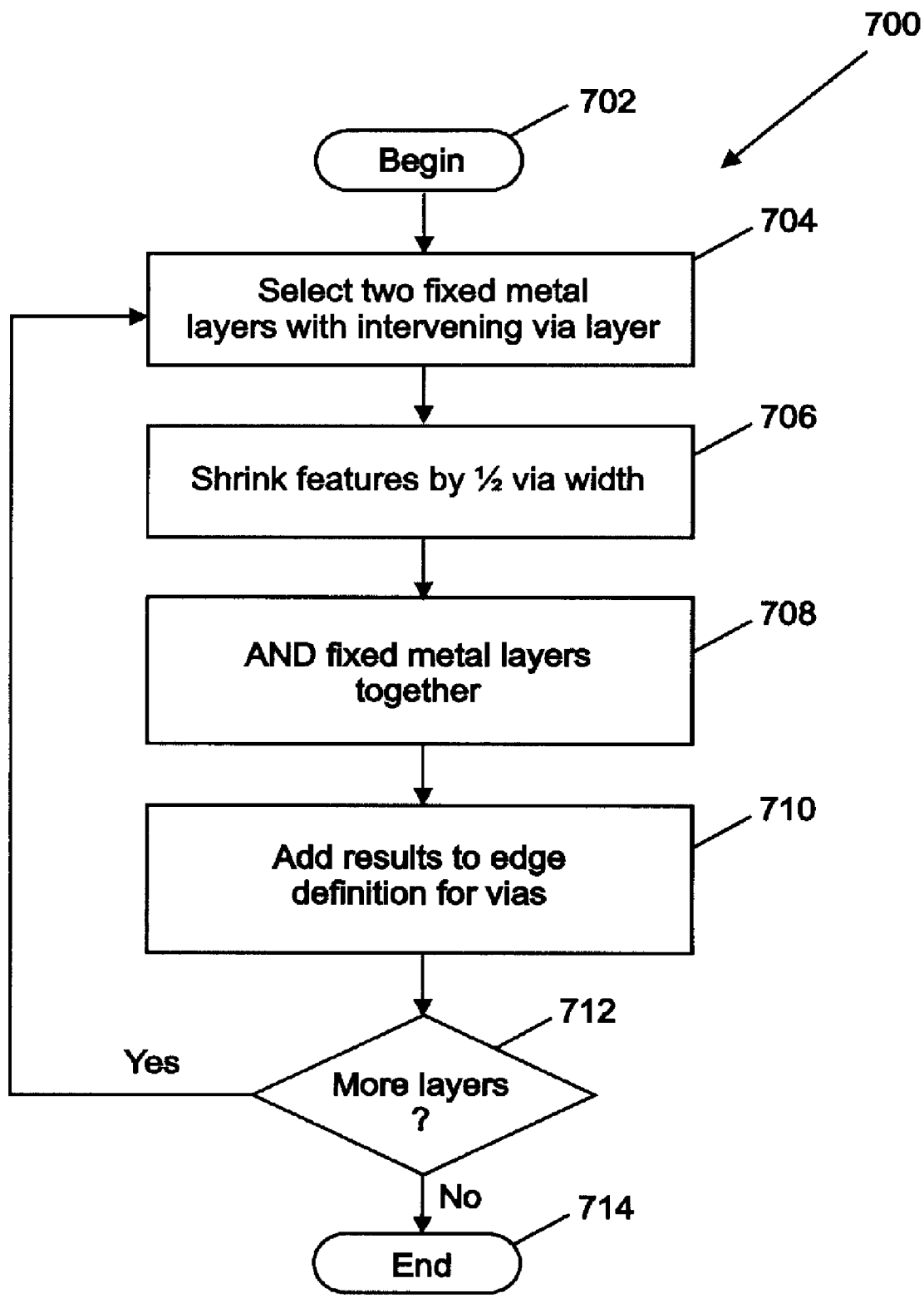
FIG. 7 is another flowchart illustrating another process according to example embodiments of the invention.

FIG. 7 is a flowchart illustrating the detection and/or creation of edges when vias are used to short wires on two different layers. Again, this flowchart is shown as a series of process blocks. Process 700 begins at block 702. At block 704, two layers with an intervening via layer are selected from the ASIC design. At block 706, all of the features on the two layers of interest are mathematically shrunk by an amount corresponding to approximately one half of a via width. Via detection is then accomplished at block 708 by logically ANDing the fixed metal features on the two layers adjacent to the via layer together. The resulting, virtual, ANDed layer will contain features only where metal is present on both of the other layers. If the resulting feature is wide enough to support a via, a connection is possible. At block 710, each location where a connection is possible becomes an edge in the routing graph. At block 712, a check is made to see if there are more layers to be processed. For example, more layers might need to be processed if the particular design contains more than two metal layers with multiple intervening, configurable via layers. If more processing is required, processing branches back to block 704. Otherwise, the process ends at block 714.

Figure 8A:
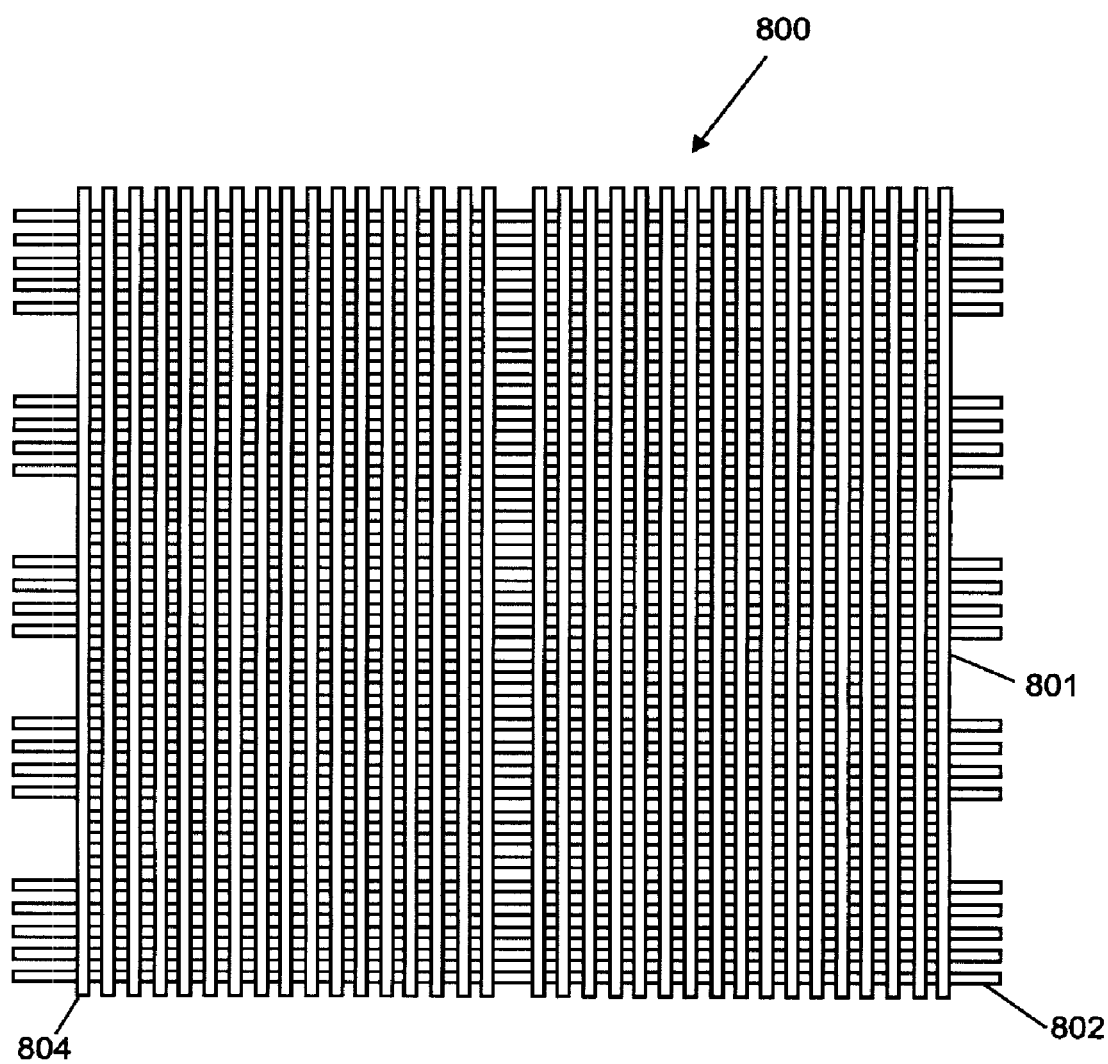
FIG. 8A illustrates the metal traces and FIG. 8B illustrates where vias can be placed.
Figure 8B:
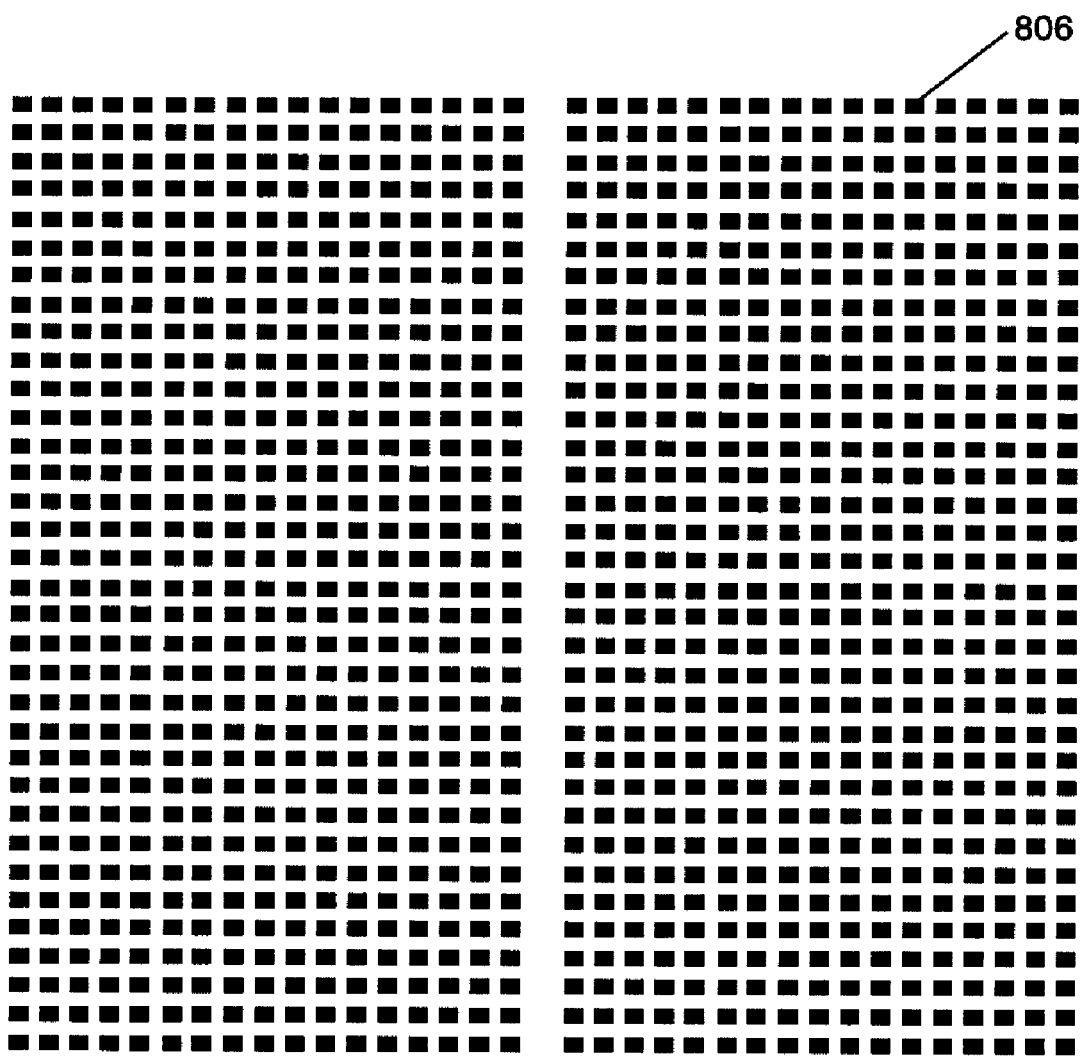

To further illustrate the logical ANDing of layers as discussed above, FIG. 8 provides a graphical, "see-through" depiction of ANDed physical layers of a section 800 of an example structured ASIC. FIG. 8A shows features 801 and 802 of fixed metal-3 and intersecting features 804 of fixed metal-4 layer the ASIC. Note that metal trace features 802 are longer than features 801, but this will have no effect on the ANDed result. FIG. 8B shows points 806 that represent the logical ANDing of the features of FIG. 8A.

The algorithm as described so far is sufficient at least for smaller structured ASIC's. However, some structured ASIC's can support designs with over 1 million gates. Such devices can have many millions of fixed metal wires, and the number of possible connections between them will be proportionally large. The amount of memory required to represent such a device can be prohibitively large. In addition, routing with such a large routing graph can be quite slow.

Figure 9:
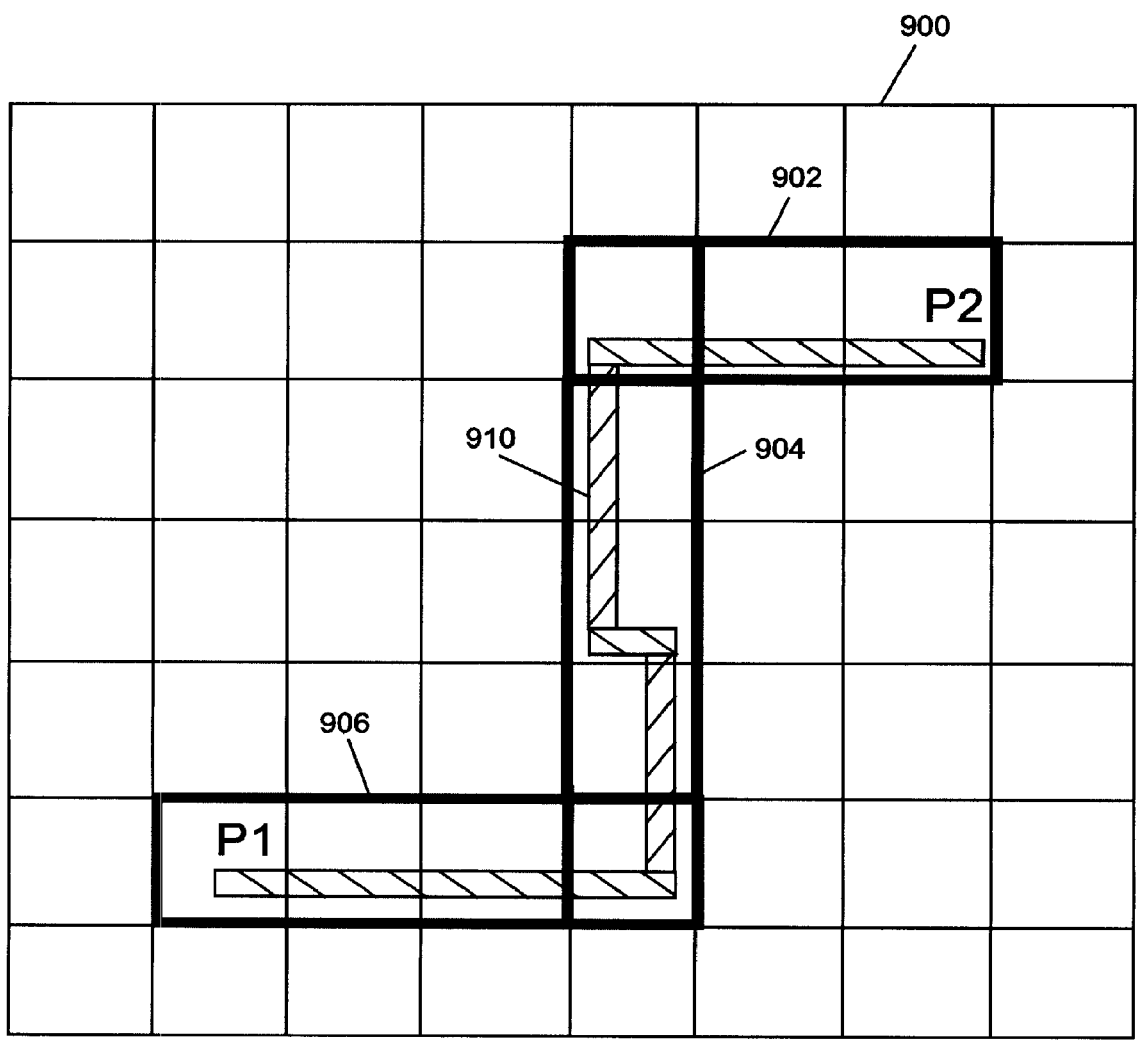
FIG. 9 illustrates an example of routing channels used by a global router.

In order to address the above issues, it may be desirable to use two types of routers to route an ASIC. A router that handles a wire-level routing graph can generally be referred to as a detailed router. To help speed up routing, a higher level router, called a global router, can be used to determine approximate paths for routes. A detailed router is then used to determine exact routing paths for each signal within the routing channels specified by the global router. FIG. 9 shows a schematic representation of a portion, 900, of a structured ASIC and an example of routing channels 902, 904, and 906 used by a global router, and detailed path 910 for a signal chosen within the selecting routing channels. In this example, the signal is routed from point P1 to point P2.

According to at least some embodiments of the invention, as a post-process to extracting a detailed routing graph, a determination is made as to which wires have similar electrical conductivity and connectivity, and these wires are grouped together into routing bundles, which can then be used as nodes in a global routing graph. Thus, provisions can be made for automatic routing of very large structured ASIC's in relatively short periods of time, while making use of fixed metal.

Routing graphs representing fixed metal can be combined with traditional routing graphs as well. Fixed wires correspond to nodes on fixed metal layers, while empty spaces available for routing correspond to nodes on configurable layers of metal. When nodes can be shorted with configurable metal, edges can be added to the routing graph to represent these nodes.

Figure 10B:
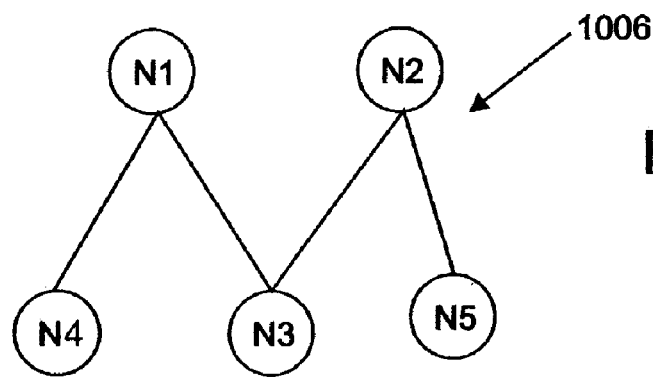
FIG. 10A shows the physical structure of the ASIC and FIG. 10B shows how the structure can be represented graphically using nodes.
Figure 10A:
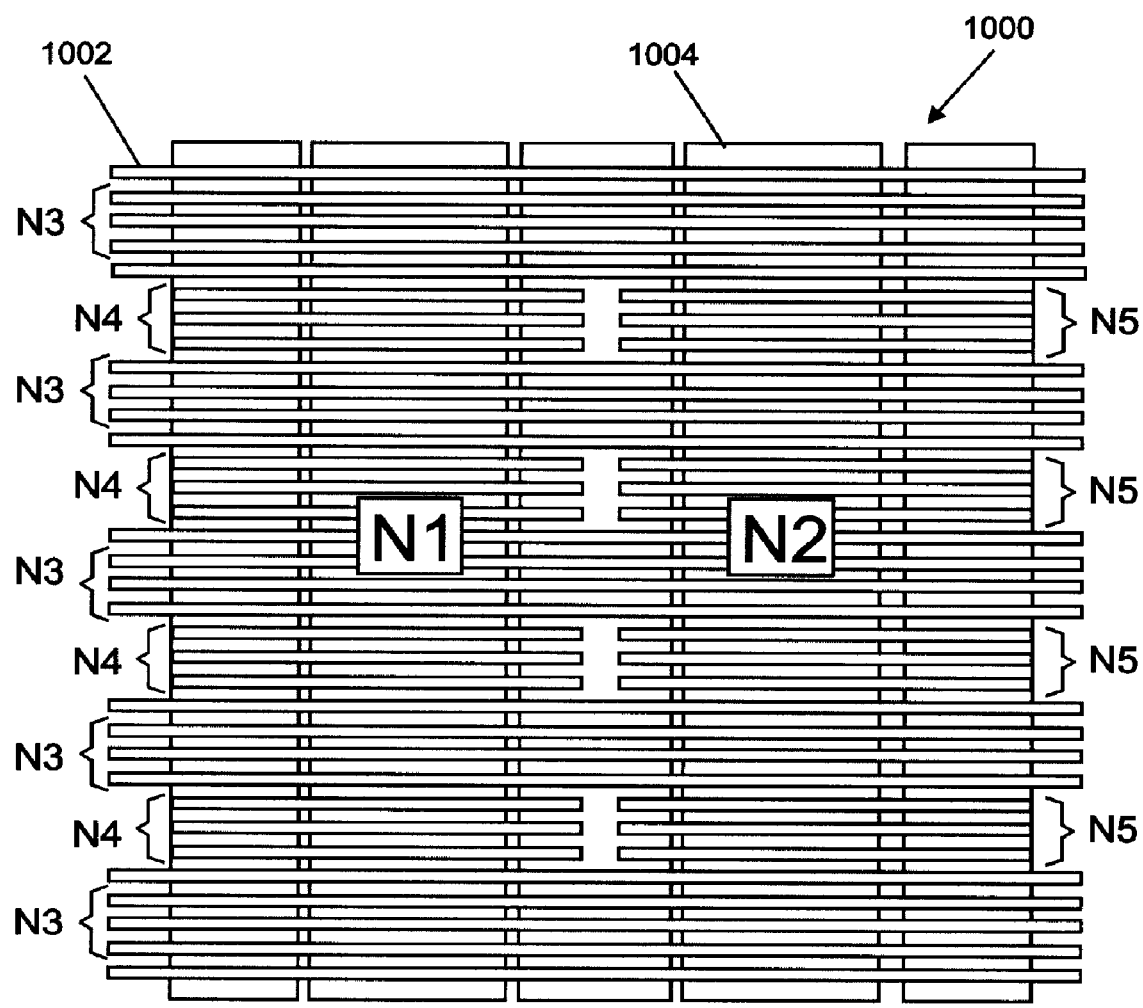

FIG. 10 illustrates a structured ASIC and a global routing graph. FIG. 10A illustrates a portion 1000 of a structured ASIC. FIG. 10A is shown as if one is looking up from the substrate in order to better reveal the specific structure—the opposite of typical convention and the other Figures shown herein, which show devices as if one was looking down through the device with each higher numbered layer appearing on top of a lower numbered layer and the substrate below all the other layers. In FIG. 10A, fixed metal wires 1002 on fixed metal-3 are shorted with configurable vias to configurable metal features 1004 on configurable metal-4. Note that routing graph nodes corresponding to metal-4 are created to represent the available space, and nodes corresponding to metal-3 are created to represent groups of similar wires. Nodes N1 and N2 are free metal nodes on metal-4, and nodes N3, N4, and N5 are nodes representing multiple wires each on metal-3. The physical positions of wires in N3, N4, and N5 are not contiguous, but these wires can be grouped together nonetheless because they have similar electrical connectivity. FIG. 10B shows the resulting global-routing graph, 1006, for the ASIC illustrated in FIG. 10A.

Following the example above, to help reduce memory usage without losing information, the preprocesses disclosed herein can make use of the fact that, indeed, most fixed wires in a structured ASIC are replicated many times across a die. Wires that have substantially identical shapes and connectivity to vias or configurable metal are described by master wires. The connection points, such as legally configurable via locations, are represented on the master wires. (By legally configurable, what is meant is that they can be configured without violating design rules.) For example, returning again to FIG. 10A, wires in N4 are not only all substantially identical to each other, but they are substantially identical to all the wires in N5. Also all the wires in N4 are substantially identical to each other. Thus, there are only two master wires required to represent the entire fixed portion of the routing graph in the example of FIG. 10.

Further, in a similar fashion, the need to represent the locations of all the wires within each bundle by detecting all nodes in the routing graph can be eliminated by recognizing the existence of substantially identical wire structures. For example, in FIG. 10A, N4 and N5 are substantially identical. They are simply instantiated in different locations. Thus, the routing bundles N4 and N5 can be defined by a common master bundle, which describes the relative locations of wires within a bundle.

Since there are typically a fairly small number of master wire types (perhaps thousands) compared to the number of distinct wire shapes found after running a traditional ASIC router, a true three-dimensional field solution can be evaluated in a reasonable amount of time to accurately determine the resistance of each master wire type, and the capacitance between the various master wire types when they are instantiated as wires next to each other. Depending on whether or not a wire is used in a signal net, or if the wire is floating, different amounts of capacitance can be applied to neighbor wires. In example embodiments, these determinations are made with a table look-up, as opposed to using two-dimensional or "2.5D" extraction techniques. ("2.5D" is a marketing term for solvers which use special two-dimensional techniques that can approximate the accuracy that would result from a true three-dimensional field solution but with less computational complexity.) The use of a look-up table results in more accurate capacitance and resistance estimates, while reducing the run-time of any estimation tool that implements an embodiment of the invention. Inductance can also be represented and extracted in a similar manner.

All of this processing of the layout of a structured ASIC in order to create a routing graph can take a lot of memory and run-time. Thus, in some embodiments, these steps are performed only once for each structured ASIC base, and the resulting routing graph and any needed wire or bundle definitions are saved in a technology file for later use by the router. Users of the structured ASIC can then simply load the technology file, and skip the extraction step.

Figure 11:
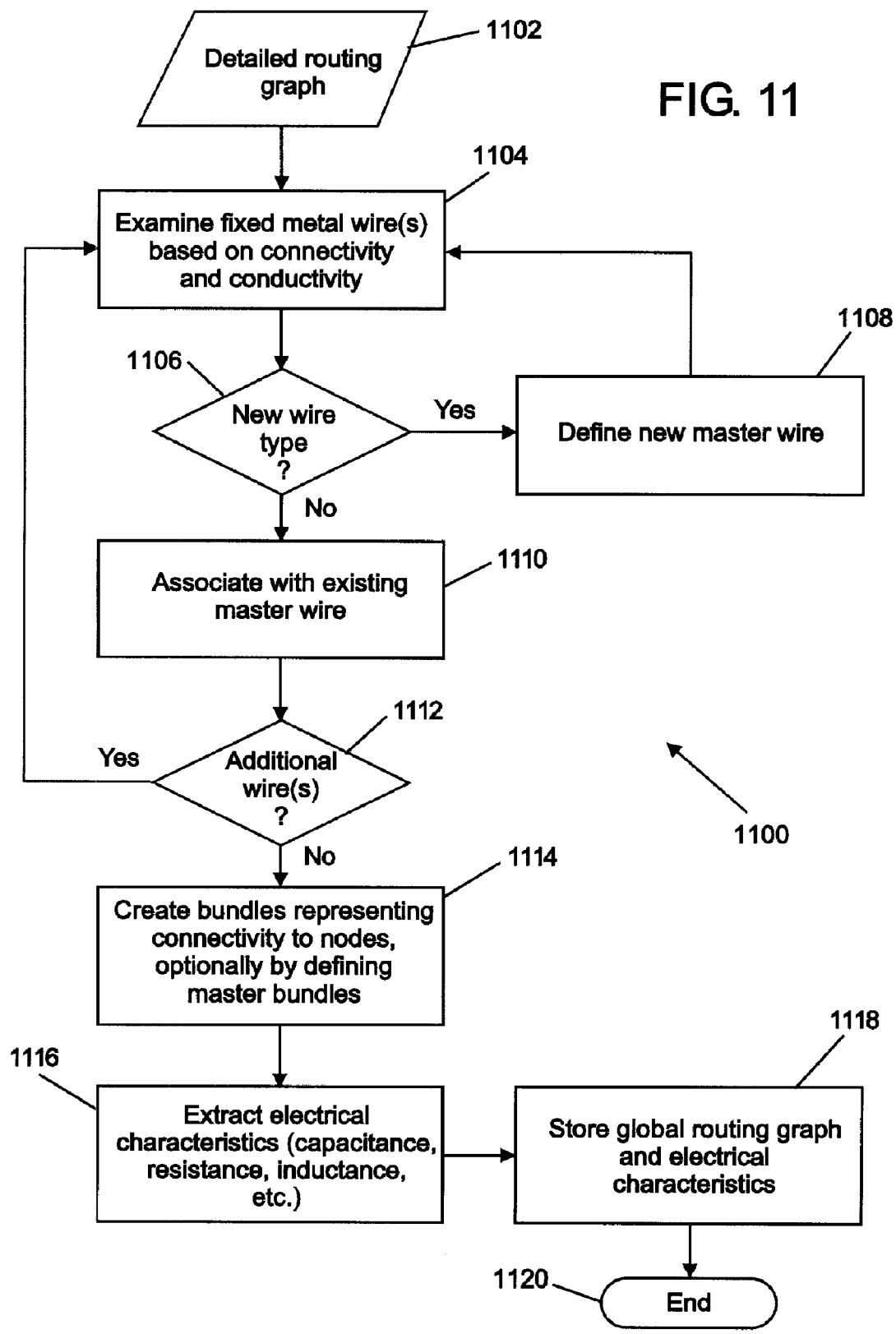
FIG. 11 is another flowchart illustrating a process according to example embodiments of the invention.

FIG. 11 illustrates an example process, 1100, for extracting a global routing graph, at least in part by using master wires and/or bundles. As before, this flowchart is presented as a series of process blocks. A detailed routing graph, 1102, serves as the input to process 1100. At block 1104, fixed metal wires are examined to make determinations based on their connectivity and conductivity. At block 1106 a determination is made as to whether a new master wire type is needed. If so, a new mater wire type is defined at block 1108, and processing returns back to block 1104. If not, the wire currently under consideration is associated with an existing master wire definition at block 1110. At block 1112, another determination is made, this time as to whether additional wires need to be examined. If so, processing again branches back to block 1104. Otherwise, processing continues so that connectivity can be dealt with.

At block 1114 of FIG. 11, bundles representing connectivity to nodes are created. This can optionally be accomplished at least in part by defining master bundles. Finally, electrical characteristics of wires can be extracted at block 1116. These can include, for example, but are not limited to, capacitance, resistance, and inductance. At block 1118 the global routing graph and the extracted electrical characteristics are stored in a technology file for use by a router, and at block 1120 the process ends.

Figure 12:
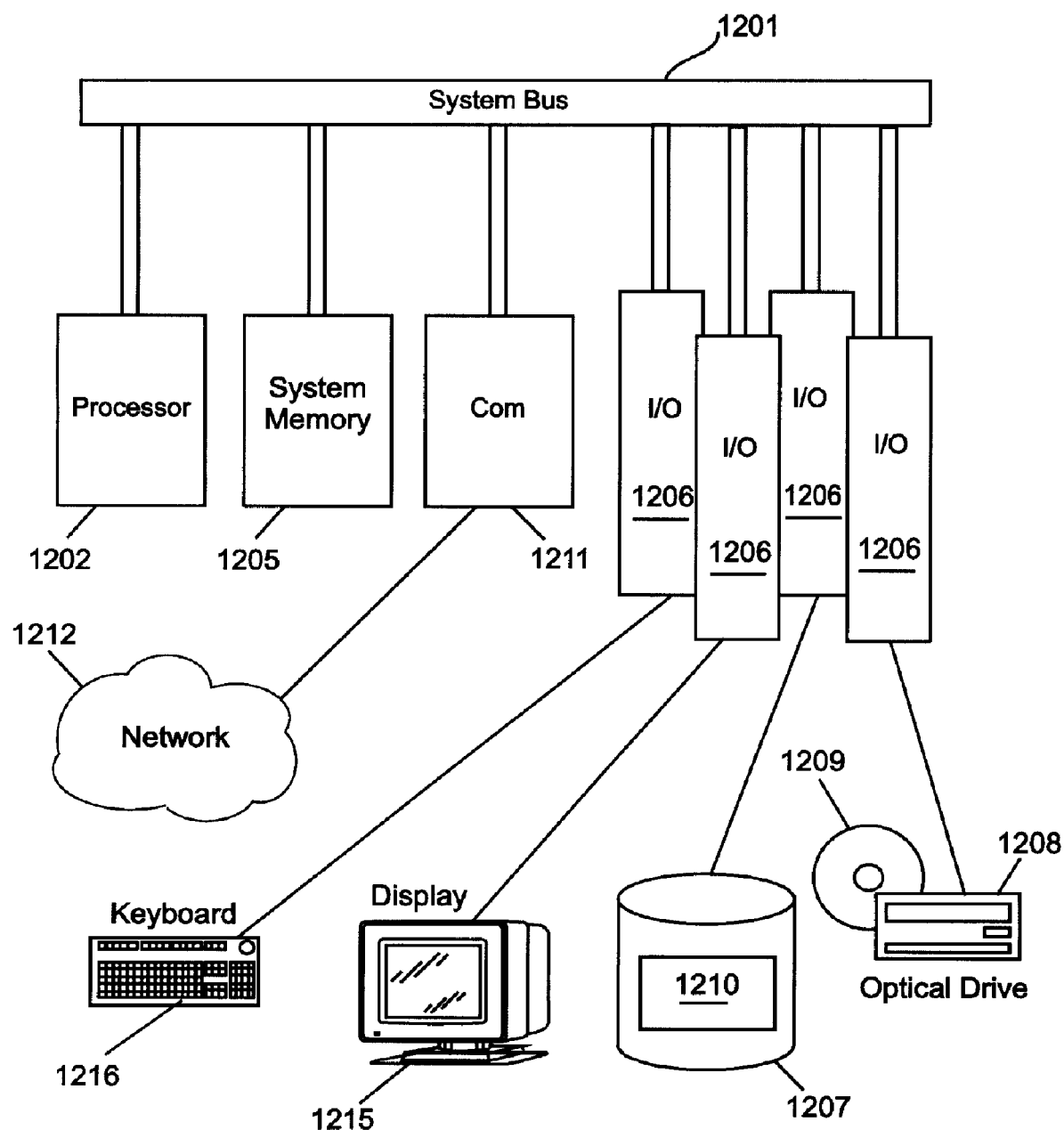
FIG. 12 is a block diagram of an instruction execution system or computing platform that can be used to implement an embodiment of the invention.

FIG. 12 illustrates an instruction execution system, workstation, or personal computer system that is programmed with application software to implement the preprocess design functions according to embodiments of the invention. Such a system can also manage media used to store technology files, or network connections used to exchange such files. System bus 1201 interconnects the major components. The system is controlled by processor 1202, which serves as the central processing unit (CPU) for the system. System memory 1205 is typically divided into multiple types of memory or memory areas such as read-only memory (ROM), and random access memory (RAM). A plurality of standard input/output (I/O) adapters or devices, 1206, is present. A typical system can have any number of such devices; only four are shown for clarity. These connect to various devices including a fixed disk drive, 1207, and a removable media optical drive, 1208. This drive accepts writable and read-only optical disks such as compact discs (CD's) and digital versatile discs (DVD's) as shown at 1209.

In a system like that of FIG. 12, computer program code instructions for implementing the appropriate functions, 1210, including the extraction of routing graphs and electrical characteristics of wires, are stored on the fixed disc, 1207. When the system is operating, the instructions are partially loaded into memory, 1205, and executed by processor 1202. Design files can be read and written from and to the fixed disc, or the optical disc 1209 when inserted into the optical drive. Additional I/O devices have specific functions. A workstation implementing all or a portion of the invention may contain an I/O device in the form of a network or local area network (LAN) communications (COM) adapter, 1211, to connect to network 1212. The network can be used to transfer software implementing the invention, or to share design files. A display, 1215, is also connected, as well as a keyboard, 1216. Any of the adapters should be thought of as functional elements more so than discrete pieces of hardware. A workstation or personal computer could have all or some of the adapter entities implemented on one circuit board. It should be noted that the system of FIG. 12 is meant as an illustrative example only. Numerous types of general-purpose computer systems and workstations are available and can be used. Available systems include those that run operating systems such as Windows™ by Microsoft, various versions of Linux, and various versions of Unix, such as those implemented by the IBM Corporation, Sun Microsystems, Inc., and Apple Computer, Inc.

Computer program elements of the invention may be embodied in hardware and/or in software (including firmware, resident software, micro-code, etc.). As shown above, the invention may take the form of a computer program product, which can be embodied by a computer-usable or computer-readable storage medium having computer-usable or computer-readable, program instructions or "code" embodied in the medium for use by or in connection with the instruction execution system. Such mediums are pictured in FIG. 12 to represent the optical disc, and the fixed disc. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and the hardware described in FIG. 12 can form the various means for carrying out the functions in some of the example embodiments.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

What is claimed is:

1. A method of customizing a structured ASIC, having at least one layer of fixed metal routing wires, for an application through the use of routing information, extracted during a routing pre-process, concerning the fixed metal routing wires in the at least one layer, the method comprising:
examining, as part of an automated routing pre-process, a physical layout for the structured ASIC, including:
automatically determining the fixed metal routing wires in the at least one layer, and
automatically determining configurable portions of the structured ASIC that may be used to connect the fixed metal routing wires, thereby configuring the structured ASIC;
creating nodes based on the examination of the physical layout, each of the nodes representing one or more fixed metal routing wires connected together in the physical layout;
creating edges based on the examination of the physical layout, the edges representing opportunities to use the configurable portions of the ASIC to connect the fixed metal routing wires, as represented by the nodes, in order to create a data structure including at least one routing graph for the structured ASIC; and
routing the structured ASIC using the at least one routing graph to produce a design file for a configured device.

2. The method of claim 1 wherein the step of creating nodes includes both creating nodes representing fixed metal routing wires and creating nodes representing empty space available for routing.

3. The method of claim 2 wherein the edges represent configurable metal traces.

4. The method of claim 2 wherein the edges represent potential locations for vias.

5. The method of claim 4 wherein the creating of the edges further comprises ANDing together metal layers to determine where vias on an intermediate layer can be placed.

6. The method of claim 2 wherein the edges represent both configurable metal traces and potential locations for vias.

7. The method of claim 1 wherein the edges represent configurable metal traces.

8. The method of claim 7 wherein the at least one routing graph is at least one detailed routing graph, and further comprising creating a global routing graph from the at least one detailed routing graph so that the data structure includes at least one detailed routing graph and a global routing graph.

9. The method of claim 1 wherein the edges represent potential locations for vias.

10. The method of claim 9 wherein the creating of the edges further comprises ANDing together metal layers to determine where vias on an intermediate layer can be placed.

11. The method of claim 10 wherein the at least one routing graph is at least one detailed routing graph, and further comprising creating a global routing graph from the at least one detailed routing graph so that the data structure includes at least one detailed routing graph and a global routing graph.

12. The method of claim 1 wherein the edges represent both configurable metal traces and potential locations for vias.

13. The method of claim 12 wherein the at least one routing graph is at least one detailed routing graph, and further comprising creating a global routing graph from the at least one detailed routing graph so that the data structure includes at least one detailed routing graph and a global routing graph.

14. The method of claim 1 wherein the at least one routing graph is at least one detailed routing graph, and further comprising creating a global routing graph from the at least one detailed routing graph so that the data structure includes at least one detailed routing graph and a global routing graph.

15. A computer program product for customizing a structured ASIC, having at least one layer of fixed metal routing wires, for an application through use of routing information, extracted during a routing pre-process, concerning the fixed metal routing wires in the at least one layer, the computer program product including a medium having computer program code embodied therein, the computer program code further comprising:
instructions for examining a physical layout for the structured ASIC, wherein examining includes:
determining the fixed metal routing wires in the at least one layer, and
determining configurable portions of the structured ASIC that may be used to connect the fixed metal routing wires, thereby configuring the structured ASIC;
instructions for creating nodes and edges based on the examination of the physical layout, each of the nodes representing one or more fixed metal routing wires connected together in the physical layout, the edges representing opportunities to use the configurable portions of the ASIC to connect the fixed metal routing wires, as represented by the nodes;
instructions for creating a data structure including a routing graph for the structured ASIC using the nodes and the edges; and
instructions for routing the structured ASIC using the routing graph to produce a design file for a configured device.

16. The computer program product of claim 15 wherein the edges can represent: configurable metal traces, potential locations for vias, or a combination thereof.

17. The computer program product of claim 16 wherein the computer program code further comprises instructions for ANDing together metal layers to determine where vias on an intermediate layer can be placed.

18. The computer program product of claim 17 wherein the instructions for creating the data structure further comprise:
instructions for creating at least one detailed routing graph; and
instructions for creating a global routing graph from the at least one detailed routing graph.

19. The computer program product of claim 16 wherein the instructions for creating the data structure further comprise:
instructions for creating at least one detailed routing graph; and
instructions for creating a global routing graph from the at least one detailed routing graph.

20. The computer program product of claim 15 wherein the computer program code further comprises instructions for ANDing together metal layers to determine where vias on an intermediate layer can be placed.

21. The computer program product of claim 20 wherein the instructions for creating the data structure further comprise:

instructions for creating at least one detailed routing graph; and instructions for creating a global routing graph from the at least one detailed routing graph.

22. The computer program product of claim 15 wherein the instructions for creating the data structure further comprise:

instructions for creating at least one detailed routing graph; and instructions for creating a global routing graph from the at least one detailed routing graph.

23. An apparatus for customizing a structured ASIC, having at least one layer of fixed metal routing wires, for an application through the use of routing information, extracted during a routing pre-process, concerning the fixed metal routing wires in the at least one layer, the apparatus comprising:

means for examining a physical layout for the structured ASIC, wherein examining includes:

determining the fixed metal routing wires in the at least one layer, and determining configurable portions of the structured ASIC that may be used to connect the fixed metal routing wires, thereby configuring the structured ASIC;

means for creating nodes and edges based on the examination of the physical layout, each of the nodes representing one or more fixed metal routing wires connected together in the physical layout, the edges representing opportunities to use the configurable portions of the ASIC to connect the fixed metal routing wires, as represented by the nodes;

means for creating a data structure including a routing graph for the structured ASIC using the nodes and the edges; and means for routing the structured ASIC using the routing graph to produce a design file for a configured device.

24. The apparatus of claim 23 further comprising means for ANDing together metal layers to determine where vias on an intermediate layer can be placed.

25. The apparatus of claim 24 wherein the means for creating the data structure further comprises:

means for creating at least one detailed routing graph; and means for creating a global routing graph from the at least one detailed routing graph.

26. The apparatus of claim 23 wherein the means for creating the data structure further comprises:

means for creating at least one detailed routing graph; and means for creating a global routing graph from the at least one detailed routing graph.

* * * * *